United States Patent [19]

Woodhouse

[11] 4,410,808
[45] Oct. 18, 1983

[54] ELECTRICAL CIRCUIT FOR DRIVING A PLURALITY OF INDUCTIVE LOADS

[75] Inventor: Richard G. Woodhouse, Birmingham, England

[73] Assignee: Lucas Industries Limited, Birmingham, England

[21] Appl. No.: 196,237

[22] Filed: Oct. 14, 1980

[30] Foreign Application Priority Data

Oct. 24, 1979 [GB] United Kingdom ............... 7936860

[51] Int. Cl.³ .................. H03K 3/01; H03K 17/60; H01H 47/00
[52] U.S. Cl. ................... 307/254; 307/270; 307/247 R; 361/166; 361/190
[58] Field of Search ............ 307/270, 254, 247; 361/152–154, 166–168, 183, 190

[56] References Cited

U.S. PATENT DOCUMENTS

| 3,231,786 | 1/1966 | Felcheck | 361/152 |
| 3,340,407 | 9/1967 | Sinclair | 361/166 |
| 3,656,000 | 4/1972 | Neathery, Jr. | 307/247 Q |
| 3,665,901 | 5/1972 | Monpetit et al. | 361/166 |

Primary Examiner—Stanley D. Miller
Assistant Examiner—B. P. Davis
Attorney, Agent, or Firm—Ladas & Parry

[57] ABSTRACT

A circuit for controlling a plurality of inductive loads, includes a plurality of low voltage transistors controlled by a flip-flop so that only one of the low voltage transistors is on at any given time. These low voltage transistors connected one end of respective ones of the loads to one rail of a supply. Diodes connect the other ends of the loads to a common point which is connected to the other rail of the supply by a single high-voltage transistor. Further diodes connect said one end of the respective loads to said other rail to protect the low voltage transistors from high voltages caused by the interruption of current in the loads.

5 Claims, 4 Drawing Figures

ELECTRICAL CIRCUIT FOR DRIVING A PLURALITY OF INDUCTIVE LOADS

This invention relates to an electrical circuit for driving a plurality of inductive loads.

One application of the invention is in electronic spark ignition systems for internal combustion engines. Such a system has been proposed in which distribution as well as spark generation is controlled electronically i.e., there are two or more ignition transformers which are separately energised, and each drives its own spark circuit. With such an arrangement each transformer primary is in series with an associated one of a plurality of output transistors. Each output transistor in the system needs to be capable of withstanding a high voltage, because of the high voltage transient which is created in a transformer type spark ignition system when the transistor is switched off. High voltage transistors are expensive and the object of the present invention is to enable the number of high voltage transistors required to be reduced.

An electrical circuit in accordance with the invention comprises a plurality of inductive loads, a plurality of low voltage transistors having their collector-emitter paths connecting one end of respective ones of the loads to one terminal of a supply, the other ends of the loads being connected to a common point, a single high voltage transistor having its collector emitter path connecting said common point to the other terminal of said supply, and means for selectively turning on said low voltage transistors one at a time. In the accompanying drawings, FIG. 1 is a circuit diagram of a simple example of the invention;

Figure 1:
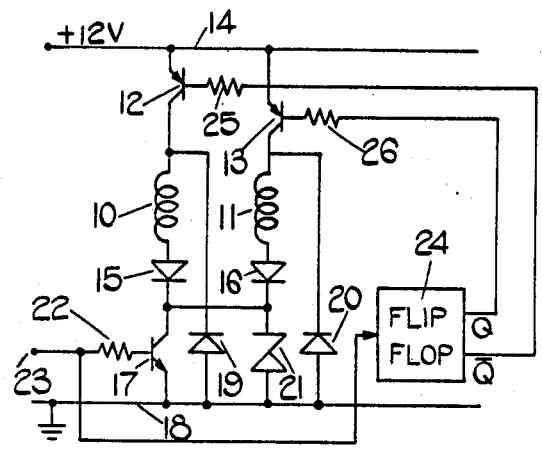
Figure 4:
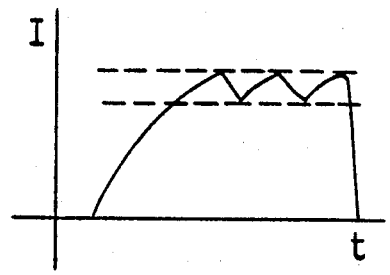
FIG. 4 is a graph showing the current in one of the loads in FIG. 3.

Referring firstly to FIG. 1, the circuit shown includes two inductive loads 10, 11. One of loads 10 is connected to the collector of a low-voltage pnp transistor 12 and the load 11 is similarly connected to the collector of a low-voltage pnp transistor 13. The emitters of transistors 12 and 13 are connected to a 12 V rail 14. The other end of each load 10, 11 is connected by an associated one of two diodes 15, 16 to a common point at the collector of a high-voltage npn transistor 17, the emitter of which is connected to an earth rail 18. The collectors of transistor 12, 13 are connected to the cathodes of two diodes 19, 20, the anodes of which are connected to the earth rail 18 and a zener diode 21 is connected between the collector of the transistor 17 and the earth rail 18.

The base of the transistor 17 is connected by a resistor 22 to an input terminal 23 which is also connected to the input of a standard flip-flop circuit 24. The Q and $\overline{Q}$ outputs of which are connected by respective resistors 25, 26 to the bases of the transistors 12, 13.

Figure 2:
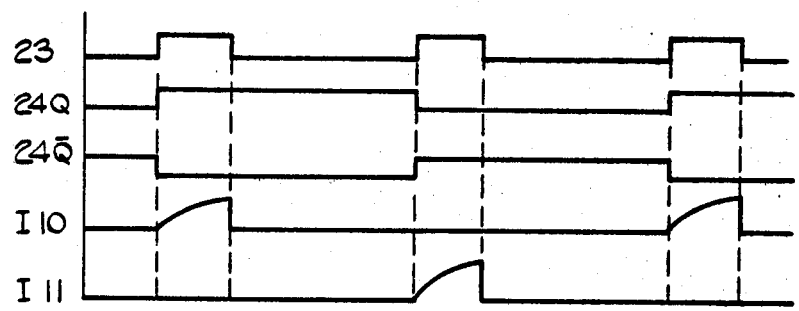
FIG. 2 is a graph showing waveforms at various points in FIG. 1.

In use, the signal applied to the input terminal 23 is as shown in the upper line in FIG. 2, i.e., terminal 23 repeatedly receives positive going pulses. Such pulses both clock the flip-flop circuit 24 and turn on the transistor 17. As will be appreciated from FIG. 2 one or other of the transistors 12, 13 is on at all times, but transistor 17 is on only for the duration of the input pulses. Since the appropriate one of the transistors 12, 13 remains on after the transistor 17 turns off, transistors 12, 13 are never subjected to high voltage transients.

Figure 3:
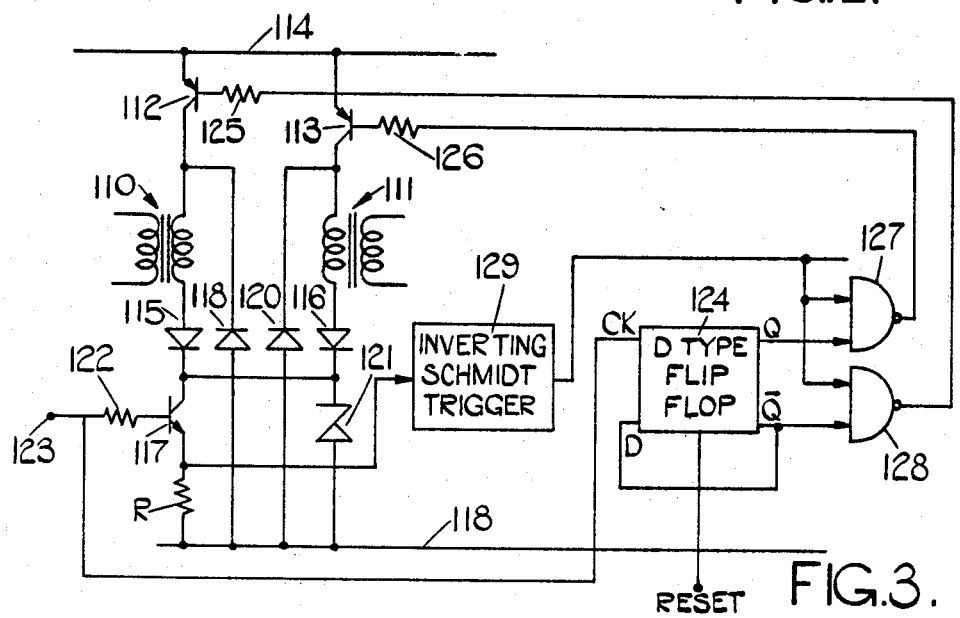
FIG. 3 is a circuit diagram of another example of the invention.

Turning now to FIG. 3, there is shown an example of the invention as applied to an internal combustion engine spark ignition system including two independent ignition transformers 110. 111, the primary windings of which represent the inductive loads corresponding to loads 10 and 11 in FIG. 1. Low voltage transistors 112 and 113 are arranged with their collector emitter paths connecting these primary windings at one end to a positive supply rail 114. Diodes 115, 116 connect the other ends of the primary windings to the collector of a common high voltage transistor 117, the emitter of which is connected to the ground rail 118 via a current sensing resistor R. Diodes 119 and 120 and a zener diode 121 are arranged like the corresponding components 19, 20 and 21 in FIG. 1.

The input terminal 123 is connected by a resistor 122 to the base of transistor 117 and is also connected to the CLOCK terminal of a D-type flip-flop circuit 124, the D input of which is connected to its $\overline{Q}$ output. The Q and $\overline{Q}$ outputs of circuit 124 are connected to two NAND gates 127 and 128 which also have inputs connected to the output of an inverting Schmidt trigger circuit 129 having its input connected to the emitter of the transistor 117.

In operation, the circuit of FIG. 3 is much like that in FIG. 1 except that the Schmidt trigger circuit provides additional control over the transistors 112 and 113 to control the current in the associated primary windings. Thus, when, for example, transistor 117 turns on and transistor 112 is conductive the current in the primary winding of transformer 110 will start to increase normally, but when the current in resistor R reaches a level such that the voltage across R exceeds the upper threshold voltage of the Schmidt trigger circuit 129. the output of the circuit 129 will go low, thereby causing the output of gate 128 to go high, and thereby turning off the transistor 112. The maximum voltage across the transistor 112 is limited by current recirculating in diode 119 and the current in the primary winding of transformer 110 decays until the voltage across resistor R falls below the lower threshold voltage of circuit 129 so that the output of this circuit goes high again. The gate 128 output then goes low again turning on transistor 112 and causing the current in the primary winding to start to rise again. When transistor 117 turns off the coil current is interrupted as before and the rapid change in current induces a spark in the normal manner. During current regulation the rate of change of the current is not high enough for a spark to be induced.

I claim:

1. An electrical circuit comprising a plurality of inductive loads, a plurality of low voltage transistors having their collector-emitter paths connecting one end of respective ones of the loads to one terminal of a supply, the other ends of the loads being connected to a common point, a single high voltage transistor having its collector-emitter path connecting said common point to the other terminal of said supply and capable of being turned on and off by a pulsating DC signal applied to its base, and means for selectively turning on said voltage transistors one at a time, and further comprising a plurality of diodes connecting said other end of respective ones of the loads to said common point, and further comprising a plurality of further diodes connecting said one end of respective ones of the loads to said other terminal.

2. An electrical circuit as claimed in claim 1 further comprising a zener diode connecting said common point to said other terminal.

3. An electrical circuit comprising a plurality of inductive loads, a plurality of low voltage transistors having their collector-emitter paths connecting one end of respective ones of the loads to one terminal of a supply, the other ends of the loads being connected to a common point, a single high voltage transistor having its collector emitter path connecting said common point to the other terminal of said supply and capable of being turned on and off by a pulsating DC signal applied to its base, and means for selectively turning on said low voltage transistors one at a time, said means for selectively turning on said low voltage transistors comprising a flip-flop circuit connected to be triggered by a signal at an input terminal which also controls said high voltage transistor.

4. An electrical circuit as claimed in claim 3 further comprising a plurality of diodes connecting said other end of respective ones of the loads to said common point and also further comprising a plurality of further diodes connecting said one end of respective ones of the loads to said other terminal and also further comprising a resistor in series with said high voltage transistor and current control means connected to said resistor and to said low voltage transistors and acting to switch on and off whichever of the low voltage transistors is on at any given time in accordance with the voltage across said resistor to regulate the current in the associated load.

5. An electrical circuit as claimed in claim 4 in which the means for selectively turning on the low voltage transistors is a flip-flop circuit connected to be triggered by a signal at an input terminal and said current control means comprises a Schmidt trigger circuit connected to said resistor and a pair of gates connected to said Schmidt trigger circuit and to respective outputs of the flip-flop circuit and controlling the respective low voltage transistors.

* * * * *